United States Patent [19]

Kawashima et al.

[11] 4,209,775
[45] Jun. 24, 1980

[54] D-A CONVERTER UTILIZING A MAIN AND AUXILIARY PULSE GENERATOR TO CONTROL THE DUTY FACTOR OF AN AVERAGED PULSE TRAIN SIGNAL

[75] Inventors: Kazumi Kawashima, Takatsuki; Yukio Koyanagi, Katano, both of Japan

[73] Assignee: Matsushita Electric Industrial Co., Ltd., Osaka, Japan

[21] Appl. No.: 944,898

[22] Filed: Sep. 22, 1978

[30] Foreign Application Priority Data

Sep. 29, 1977 [JP] Japan ............................ 52-117484

[51] Int. Cl.² .................................................. H03K 13/02
[52] U.S. Cl. ........................ 340/347 DA; 235/92 TF; 340/347 M; 455/179
[58] Field of Search ............... 340/347 M, 347 DA; 325/464, 420; 235/92 TF

[56] References Cited

U.S. PATENT DOCUMENTS

| | | | |
|---|---|---|---|
| 3,603,977 | 9/1971 | Szabo et al. | 340/347 M X |
| 3,648,275 | 3/1972 | Bower | 340/347 DA |
| 4,085,372 | 4/1978 | Mogi et al. | 340/347 DA |
| 4,087,813 | 5/1978 | Minner et al. | 235/92 TF X |

*Primary Examiner*—Thomas J. Sloyan
*Attorney, Agent, or Firm*—Stevens, Davis, Miller & Mosher

[57] ABSTRACT

A D-A converter for converting a digital signal to a duty factor of a pulse train signal and for averaging the pulse signal by a low-pass filter to convert it to an analog signal is disclosed. A plurality of pulses which are to be selected in accordance with the input digital signal comprise a plurality of basic pulses of different phases and pulse widths derived by frequency division and auxiliary basic pulses which occur at a cycle period which is at least twice as long as a repetition cycle period of the basic pulses. The basic pulses are selected by high order bits of the digital signal while the auxiliary basic pulses are selected by low order bits of the digital signal to produce an output pulse train signal a duty factor of which changes in accordance with the digital signal. The pulse train signal is then averaged to convert it to an analog signal.

2 Claims, 9 Drawing Figures

FIG.8

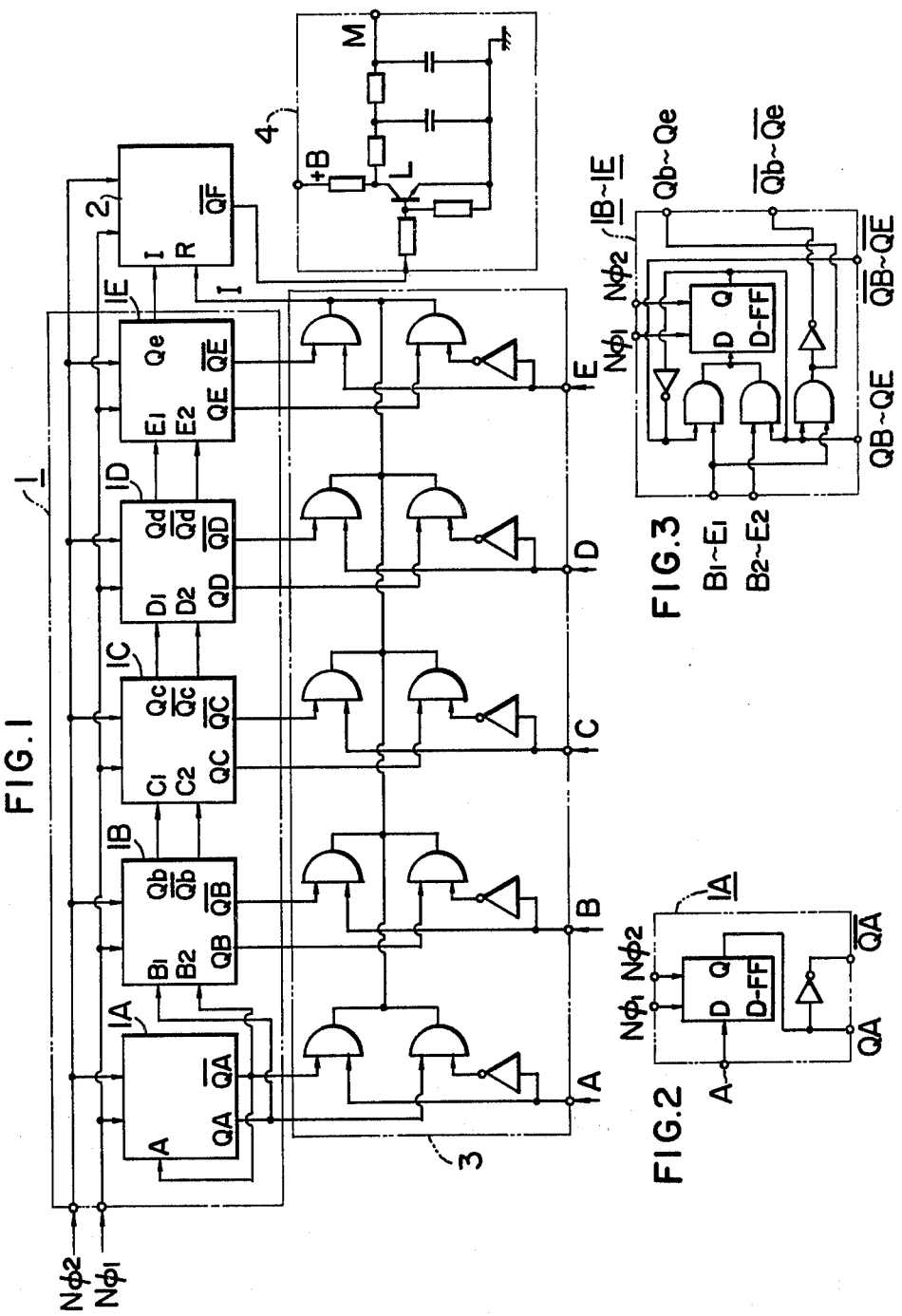
FIG.1
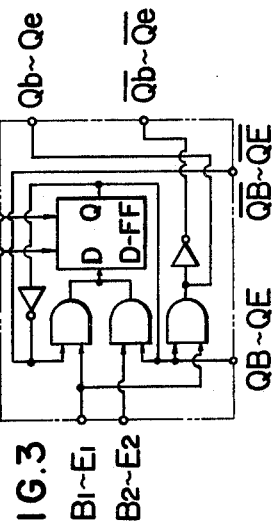
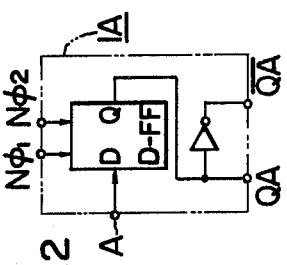
FIG.2
FIG.3

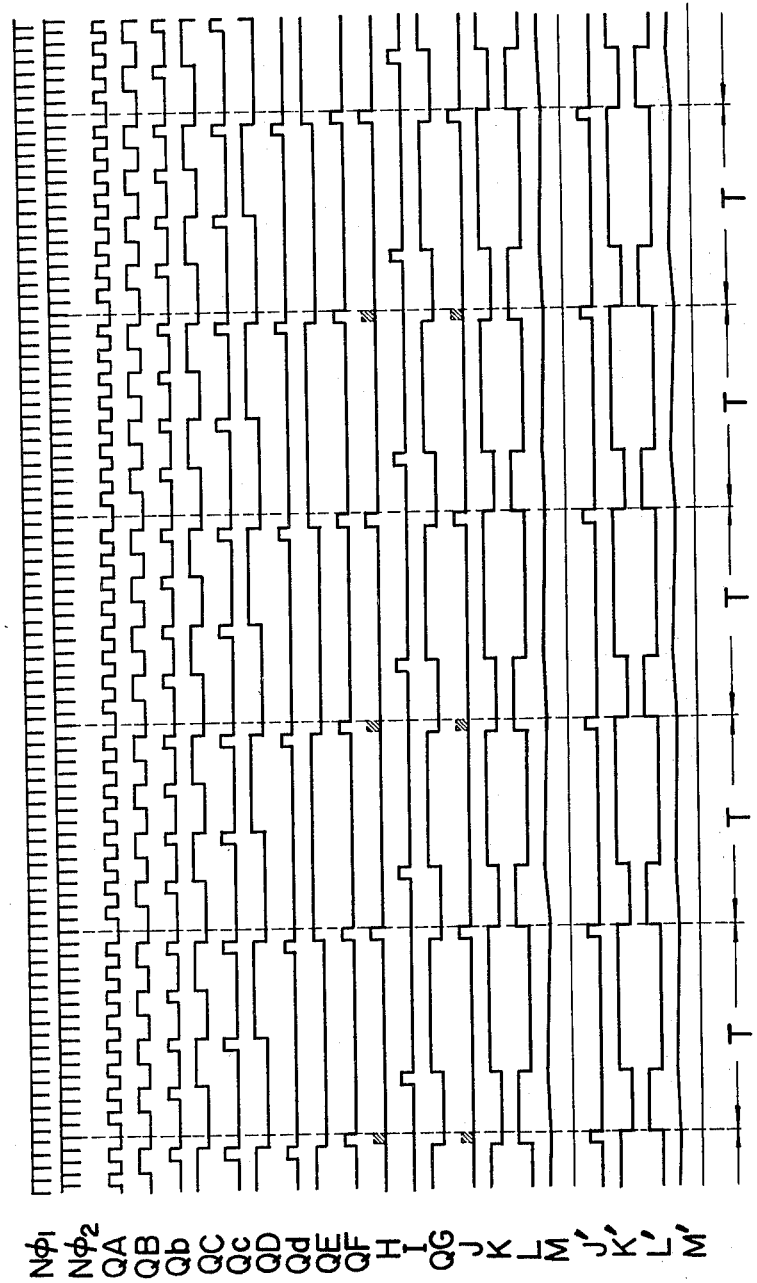

D-A CONVERTER UTILIZING A MAIN AND AUXILIARY PULSE GENERATOR TO CONTROL THE DUTY FACTOR OF AN AVERAGED PULSE TRAIN SIGNAL

The present invention relates to a D-A converter for converting a digital signal to a duty factor of a pulse train signal and averaging the pulse train by a low-pass filter to convert it to an analog signal. It provides a D-A converter which can enhance conversion precision or is of simplified construction.

In general, in the D-A converter of this type, for a given frequency of clock pulses for driving a counter, a greater number of bits are required to enhance the precision of an analog output, that is, the resolution power. However, when the number of bits are increased, the repetition cycle period of pulses when the digital signal is converted to a pulse width becomes longer. Accordingly, a time constant of a filter must be chosen to be large enough to minimize ripple. As a result, the response speed of the filter slows down. For example, where a D-A converter of this type is used in a television receiver to supply a tuning voltage to an electronic tuner, a long time period is required before a picture image stabilizes when a channel is changed if the response speed of the filter is slow, and an unstable state during switching of the picture image presents a distorted image to a viewer.

It is, therefore, an object of the present invention to provide a D-A converter which can solve the problem discussed above and can enhance conversion precision or resolution power without raising the frequency of the clock.

It is another object of the present invention to provide a D-A converter which overcomes the drawbacks encountered in the prior art apparatus and can reduce a ripple component in the output without raising the clock frequency or increasing the time constant of the low-pass filter and hence attain high precision D-A conversion.

In order to attain the above objects, a plurality of pulses which are to be selected in accordance with the digital signal comprise a plurality of basic pulses having different pulse widths which are derived by frequency division and auxiliary basic pulses which occur at a cycle period which is at least twice as long as a repetition cycle period of the basic pulses. The basic pulses are selected by high order bits of the digital signal while the auxiliary basic pulses are selected by low order bits of the digital signal so that an output pulse signal is produced having a pulse width which changes in accordance with the digital signal. The output pulse signal is averaged by a low-pass filter to change it to an analog signal.

With this arrangement, if the repetition cycle period of the auxiliary basic pulses is n times (n being a positive integer equal to or larger than two) as long as the repetition cycle period of the basic pulses, the weighting ratio thereof relative to the basic pulse is one n-th ($1/n$). Thus, by selecting the auxiliary basic pulses by the low order bits of the digital signal, an output signal weighted to correspond to the low order bits can be produced. In this manner, the D-A conversion can be attained.

By the use of auxiliary basic pulses, the pulse width of the basic pulses corresponding to the high order bits can be reduced by the factor of n and the repetition cycle period of the output pulse having its pulse width controlled in accordance with the digital signal can also be reduced. Therefore, when the same clock pulses as those in the prior art apparatus are used and a low-pass filter having the same time constant as that in the prior art apparatus is used to average the output pulses, the ripple component of the analog signal is reduced because the repetition cycle of the output pulses is shorter. Accordingly, conversion precision can be enhanced.

By way of example, the conversion of a 5-bit digital signal to an analog signal is specifically explained. Clock pulses are frequency divided to produce four kinds of basic pulses having pulse widths at a ratio of $2^0:2^1:2^2:2^3$. Those basic pulses are selected by four high order bits of the digital signal. The repetition cycle period of those basic pulses is equal to the repetition cycle period of the basic pulse having the pulse width of $2^3$. In addition, auxiliary basic pulses having a pulse width of $2^0$ are produced at a cycle period which is twice as long as the repetition cycle of the basic pulse having the pulse width of $2^3$, and those auxiliary basic pulses are selected by the lowermost bit of the digital signal. By an output of the selected basic pulse and a selected output of the auxiliary pulse, an output pulse signal is produced having a pulse width which changes in accordance with the input digital signal. In this case, since the auxiliary basic pulse is produced once per two cycle periods, the weighting thereof is equal to $\frac{1}{2}$. Accordingly, when it is combined with the basic pulses, the ratio of the pulse widths is substantially $\frac{1}{2}:2^0:2^1:2^2:2^3$. Therefore, the D-A conversion which is equivalent to that which would be attained in a prior art apparatus using five kinds of basic pulses at the ratio of $2^0:2^1:2^2:2^3:2^4$ can be attained. Furthermore, since the maximum pulse width of the basic pulse was $2^4$ in the prior art apparatus, the repetition cycle period of at least $2^4 \times 2$ was required for the output pulse signal. In the present invention, the maximum pulse width of the basic pulse is $2^3$. Therefore, when the pulse width of $2^0$ of the auxiliary basic pulse is added, the repetition cycle period of the output pulse signal is $(2^3+2^0)\times 2$, which is approximately one half of that in the prior art apparatus. Accordingly, by reducing the repetition cycle period of the output pulse signal in this manner, the averaging effect in the low-pass filter can be enhanced and the ripple component of the analog signal output can be reduced to approximately one half without raising the frequency of the clock pulses and increasing the time constant of the low-pass filter. Accordingly, the conversion precision can be materially enhanced.

The present invention will be further described with reference to accompanying drawings in which:

FIG. 1 is a circuit diagram of a prior art D-A converter;

FIGS. 2, 3, 4 and 5 show circuit diagrams of flip-flops used in the converter of FIG. 1;

FIG. 9 shows a time chart for illustrating the operation of the converter of FIG. 7.

Figure 5:
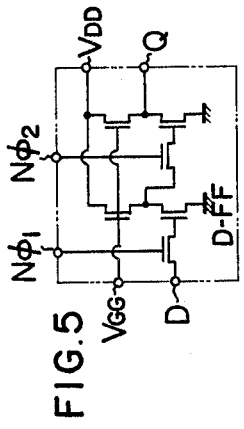
Figure 4:
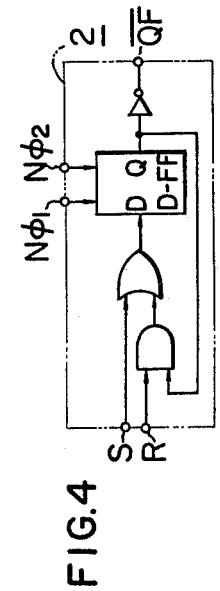

Referring to FIG. 1, a prior art D-A converter is first explained. It shows an example where a 5-bit input digital signal E D C B A is D-A converted. The circuit is operated by clock pulses $N\phi_2$ of different phases, as shown. The circuit comprises P-channel MOS's and a 5-bit counter consisting of flip-flops 1A–1E. The flip-flop 1A is shown in FIG. 2, and the flip-flops 1B–1E are shown in FIG. 3. Numeral 2 denotes a flip-flop which is shown in FIG. 4. The D-type flip-flops used in FIGS. 2–4 are of the dynamic memory type which have been conventionally used and are constructed as shown in FIG. 5. The operation thereof is well known and hence the explanation thereof is omitted here. The flip-flops 1B–1E are T-type flip-flops constructed by the D-type flip-flops and numeral 2 denotes an S-R flip-flop constructed by the D-type flip-flop. Numeral 3 denotes a control gate circuit and a numeral 4 denotes a low-pass filter.

The 5-bit counter 1 produces output signals which are frequency division signals of the clock pulse $N\phi_2$ in synchronism with the clock pulses $N\phi_1$ and $N\phi_2$. The outputs of the flip-flops 1A–1E are shown by QA, QB, QC, QD and QE in FIG. 6 which are synchronized with the fall of the clock pulse $N\phi_2$. $\overline{QA}$, $\overline{QB}$, $\overline{QC}$, $\overline{QD}$ and $\overline{QE}$ are inverted outputs of QA, QB, QC, QD and QE, respectively. Outputs Qb, Qc, Qd and Qe of the flip-flops 1B–1E each has a pulse width corresponding to one cycle of the clock pulse $N\phi_2$ and they are produced one for each cycle of QB, QC, QD and QE, respectively, to drive the next stage T-type flip-flop.

The S-R flip-flop 2 is set by the output QE of the final stage flip-flop 1E of the counter 1 and reset by an output I of the gate circuit 3. In this manner, an output $\overline{QF}$ (an inversion of QF shown in FIG. 6) is produced. The output I of the gate circuit 3 is a compare output of input digital signals A–E with the output of the counter 1. In the example shown in FIG. 6, the input digital signal comprises A=1, B=0, C=0, D=1 and E=0. A duty factor of the output $\overline{QF}$ is changed in accordance with the digital signals A–E.

The output $\overline{QF}$ of the S-R flip-flop 2 is applied to a base of a drive transistor of the low-pass filter 4 to produce an output L at a collector thereof, which output is applied to a CR time constant circuit to produce an output analog signal M. In this manner, the D-A conversion is attained.

Figure 6:
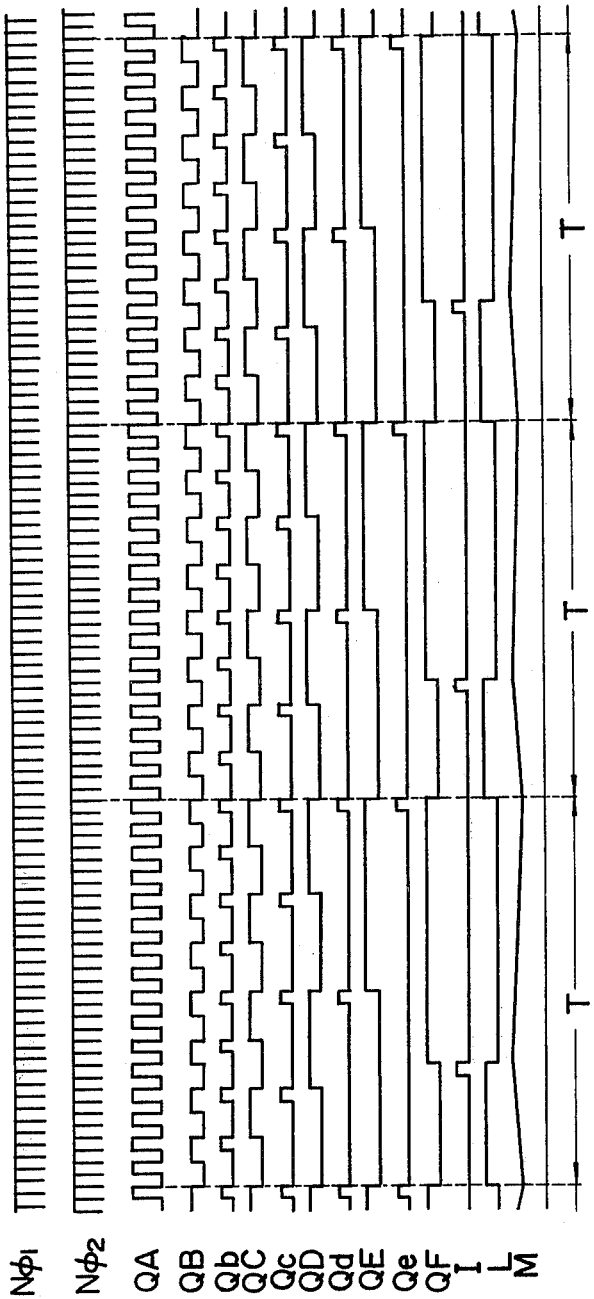
FIG. 6 shows a time chart for illustrating the operation of the converter of FIG. 1.

A problem encountered here is that a ripple component is included in the output analog signal M shown in FIG. 6 (in which it is exaggeratively shown for illustrative purpose), and it is necessary to reduce the ripple component in order to enhance the precision of the D-A conversion or the resolution power. In the prior art D-A converter shown in FIG. 1, however, it is absolutely necessary to increase the time constant of the low-pass filter in order to reduce the ripple component while maintaining the clock frequency unchanged. As a result, the response speed slows down. This means that when the D-A converter is used in a television receiver to change a channel selection voltage to be applied to an electronic tuner, the actual switching of voltage at the time of channel switching is delayed and hence a transition time is lengthened. On the other hand, if the ripple component is to be reduced while the time constant of the low-pass filter remains unchanged, the clock pulse frequency must be raised. In this case, circuit components capable of operating at high speed must be used. Accordingly, the cost of the converter increases and a high frequency noise is generated.

One embodiment of the present invention is now explained with reference to FIGS. 7–9. The present embodiment shows an example where a 5-bit digital signal is converted to an analog signal.

Figure 7:
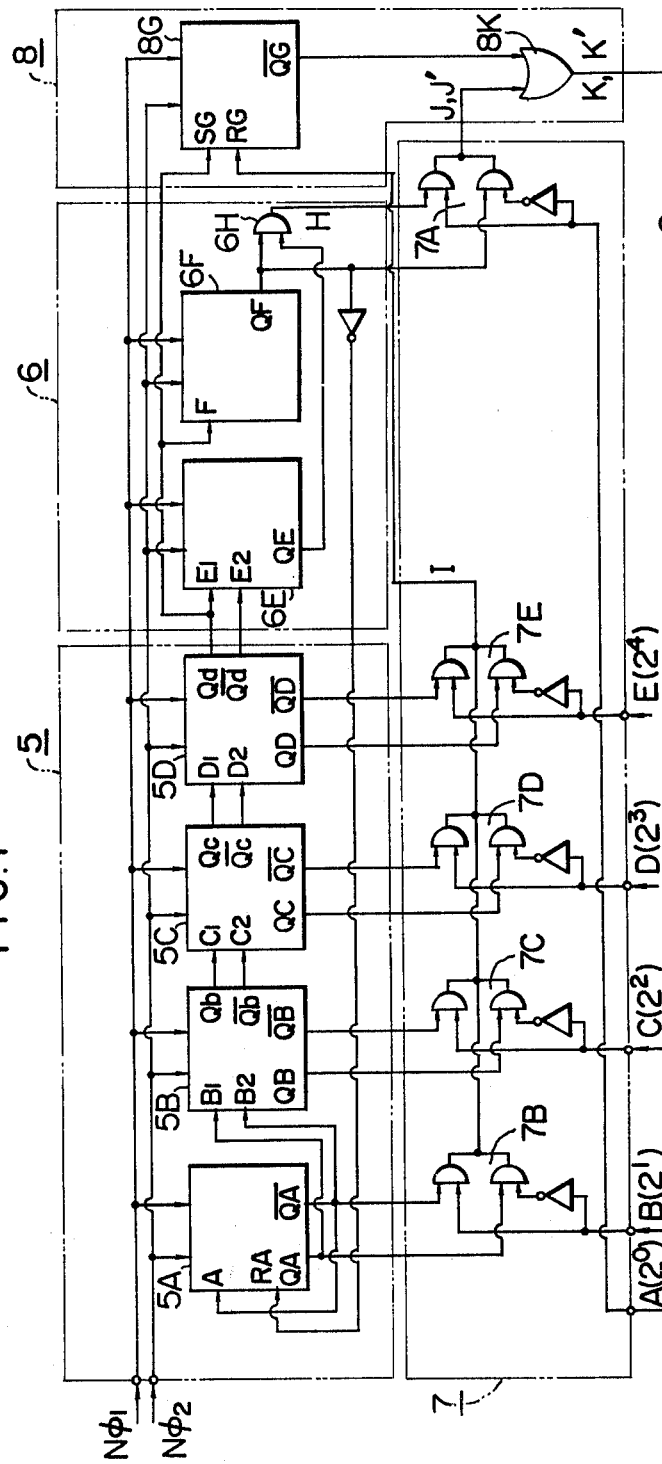
FIG. 7 is a circuit diagram of a D-A converter in accordance with one embodiment of the present invention.
Figure 8:
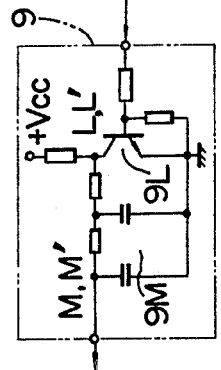
FIG. 8 is a circuit diagram of a flip-flop used in the converter of FIG. 7.
Figure 8:
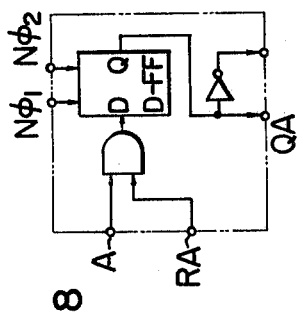

FIG. 7 is a circuit diagram showing the construction, in which numeral 5 denotes a basic pulse generator for generating four types of basic pulses, 6 denotes an auxiliary basic pulse generator for generating auxiliary basic pulses, 7 denotes a gate circuit for selecting the basic pulses and the auxiliary basic pulses in accordance with the 5-bit input digital signal E D C B A, 8 denotes an output pulse generator for generating an output pulse signal having a pulse width which changes in accordance with the input digital signal by the selected basic pulse and auxiliary basic pulse, and 9 denotes a low-pass filter for averaging the output pulse signal to produce an analog signal.

The basic pulse generator 5 comprises four cascade-connected flip-flops 5A–5D. The flip-flop 5A is a D-type flip-flop, to which a gate is added as shown in FIG. 8 to make it resettable. The flip-flops 5B–5D are T-type flip-flops which are similar to that shown in FIG. 3. Flip-flops 5A–5D are exactly the same as conventionally used except that the flip-flop 5A is resettable, and they frequency-divide the clock pulse $N\phi_2$ by the clock pulses $N\phi_1$ and $N\phi_2$ applied as shown in FIG. 9 to produce frequency-divided outputs QA, QB, Qb, QC, Qc, QD and Qd. QA, QB, QC and QD have pulse widths of $2^0$, $2^1$, $2^2$, $2^3$ respectively, which have different phases. They are used as the four types of basic pulses.

On the other hand, the auxiliary pulse generator 6 comprises flip-flops 6E and 6F and a gate 6H. The flip-flop 6E is a T-type flip-flop as shown in FIG. 3 and the flip-flop 6F is a D-type flip-flop as shown in FIG. 2. The flip-flops 6E and 6F are applied with the output of the flip-flop 5D to produce outputs QE and QF shown in FIG. 9, respectively. The output QF is thus inverted for each cycle of the output of the flip-flop 5D and the output QF is a pulse which is produced one bit period later from the output of the flip-flop 5D and has a pulse width of $2^0$. By ANDing the outputs QE and QF in the gate 6H, an output as shown in FIG. 9H is produced which has auxiliary basic pulses having a pulse width of $2^0$ which are produced once per two repetition cycle periods of the basic pulses. In the present embodiment, however, since the pulses are averaged after they have been inverted, low levels of the pulses represent information except L, L', M and M'. Accordingly, in FIG. 9H, the hatched portions essentially represent the auxiliary basic pulses. In FIG. 9, T represents the repetition cycle period of the basic pulse. This repetition cycle period T is determined by the maximum pulse width of the basic pulses, that is, the repetition cycle period of the output QD. Since the frequency of the auxiliary basic pulses H is one half of that of the basic pulses, the weighting thereof is one half. As a result, the weighting ratio of the pulse widths for H, QA, QB, QC and QD is $\frac{1}{2}:2^1:2^2:2^3 = 2^0:2^1:2^2:2^3:2^4$.

In order to avoid the overlap of the auxiliary basic pulses H with the basic pulses, the output QF of the flip-flop 6F is inverted by an inverter so that the first stage flip-flop 5A is reset for one bit period.

Accordingly, by this reset operation, the repetition cycle period of the basic pulses is increased by one bit period to $(2^3 \times 2 + 1)$ bit period, but it is still approximately one half of the period in the prior art converter, that is, $(2^4 \times 2)$ bit period.

The basic pulses QD, QC, QB and QA from the basic pulse generator 5 are applied to gates 7E, 7D, 7C and 7B, respectively, of the gate circuit 7 and they are selected by the four high order digit signals E, D, C and B of the input digital signal to produce a gate signal as shown in FIG. 9I, the position of which changes in accordance with the content of the four high order digits. The gate output I is applied to an S-R flip-flop 8G of the output pulse generator 8, which is set or reset by the output QD of the flip-flop 8D and the gate output I to produce a pulse having a pulse width which changes in accordance with the four high order digits of the input digital signal as shown in FIG. 9 QG. The flip-flop 8G is also constructed as shown in FIG. 4. The manner in which the pulse QG is produced from the flip-flop 8G is exactly the same as that of the prior art apparatus.

On the other hand, the auxiliary basic pulses from the auxiliary basic pulse generator 6 are applied to a gate 7A in the gate circuit 7 and they are selected by the lowermost bit A of the input digital signal. Thus, when the lowermost bit A of the input digital signal is "1", the auxiliary basic pulses are passed as shown in FIG. 9J and when it is "0", the auxiliary basic pulses are not passed as shown in FIG. 9J'. It should be noted that in FIG. 9J' the portions corresponding to the auxiliary basic pulses are at high level and hence the auxiliary basic pulses are eliminated. At this time, the output QF which is free of the auxiliary basic pulse component is applied to the other input of the gate 7A so that when the lowermost digit A is "1" the output H is produced as the output J and when it is "0", the output QF is produced as the output J'. In this manner, the above condition is met.

The output QG from the flip-flop 8G and the outputs J and J' from the gate 7A are combined in a gate 8K to produce output pulse signals K and K' pulse widths of which change in accordance with the content of all of the bits of the input digital signal. Those output pulse signals are inverted by a transistor 9L of the low-pass filter 9 to produce outputs L and L', which are averaged by time constant circuit 9M to produce analog outputs M and M'.

In this manner, in the present apparatus, the repetition cycle period of the output pulse signals K and K' applied to the low-pass filter 9 can be reduced to approximately one half of that in the prior art apparatus. Therefore, an analog output including reduced ripple component can be produced without raising the frequency of the clock pulses or increasing the time constant of the low-pass filter 9. Thus, conversion precision is materially enhanced.

If the same conversion precision as that in the prior art apparatus is permitted, the clock pulse frequency can be lowered and hence the circuit can be simplified or the time constant of the low-pass filter 9 can be reduced while increasing the switching speed.

While the auxiliary basic pulses are used for only the lowermost digit in D-A converting the 5-digit input digital signal in the above embodiment, the auxiliary basic pulses may be used for two or more low order digits. In general, the auxiliary basic pulses may be used for any number of low order digits to attain the same effect so long as the pulse width of the auxiliary basic pulses is narrower than the maximum pulses width of the basic pulses.

As described hereinabove, the present invention provides the D-A converter for converting the input digital signal to the pulse width of the output pulse signal and averaging it to convert to the analog signal, in which a plurality of types of basic pulses of different pulse widths and the auxiliary basic pulses which are produced at a cycle period which is at least two times as long as the repetition cycle period of the basic pulses are used. The basic pulses are selected by the high order bits of the input digital signal while the auxiliary basic pulses are selected by the low order bit(s) of the input digital signal to produce an output pulse signal having a pulse width which changes by the selected outputs in accordance with the content of the input digital signal. The output pulse signal is averaged by the low-pass filter to convert it to the analog signal. Thus, by the introduction of the auxiliary basic pulses, the repetition cycle period of the output pulse signal can be reduced and hence the conversion precision can be materially enhanced without raising the frequency of the clock pulses or increasing the time constant of the low-pass filter. If the same conversion precision as that in the prior art apparatus is required, the frequency of the clock pulses can be lowered or the time constant of the low-pass filter can be reduced. Accordingly, the configuration can be simplified.

The D-A converter of the present invention may be used in a television receiver, in which tuning voltages to be applied to an electronic tuner are stored in a memory in the form of digital signals, which are read out of the memory at the time of channel selection and D-A converted to produce the tuning voltage. In this case, the time constant of the low-pass filter can be reduced so that the response speed at the time of channel selection can be increased to shorten the period of instability condition before the picture image stabilizes when the channel is changed.

What we claim is:

1. A D-A converter for converting an input digital signal into a duty factor of a pulse train signal and averaging said pulse train signal to convert it to an analog signal comprising:

means for providing clock pulses;

a frequency divider basic pulse generator for frequency-dividing said clock pulses to generate a plurality of basic pulses having respective different weighted pulse widths produced by $2^0, 2^1, 2^2, \ldots 2^n$ divider positions during a $2^n$ bit period, where n is a positive integer and a bit period corresponds to the width of a basic pulse produced by the $2^0$ divider position;

reset means for controlling said basic pulse generator to render said basic pulse generator inoperative during only one bit period following said $2^n$ bit period and subsequently rendering said basic pulse generator operative after a $(2^n+1)$ bit period;

an auxiliary basic pulse generator for generating auxiliary basic pulses during said one bit period when said basic pulse generator is inoperative at a cycle period which is at least twice as long as said $(2^n+1)$ bit period;

a gate circuit for selecting said basic pulses by high order bits of said input digital signal and selecting said auxiliary basic pulses by at least one low order bit of said input digital signal;

an output pulse signal generator controlled by the selected outputs from said gate circuit to produce an output pulse signal having a duty factor which changes in accordance with the content of said input digital signal; and a low-pass filter for averaging said output pulse signal to convert it to an analog signal.

2. A D-A converter according to claim 1, wherein said basic pulse generator comprises a plurality of cascade-connected flip-flops, and said auxiliary basic pulse generator comprises a first flip-flop for frequency-dividing an output of the final stage flip-flop of said basic pulse generator, a second flip-flop which is triggered by said output of said final stage flip-flop to produce pulses of a pulse width of one bit period at the repetition cycle period $(2^n+1)$ of said basic pulses and a gate for combining the outputs of said first and second flip-flops to produce the auxiliary basic pulses of the pulse width of one bit period which are produced one for every two repetition cycle periods of said basic pulses.

* * * * *